(12) United States Patent
Lin et al.

(10) Patent No.: US 7,754,598 B2
(45) Date of Patent: Jul. 13, 2010

(54) METHOD FOR MANUFACTURING CORELESS PACKAGING SUBSTRATE

(75) Inventors: Wei-Hung Lin, Hsinchu (TW); Zao-Kuo Lai, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 290 days.

(21) Appl. No.: 12/068,256

(22) Filed: Feb. 5, 2008

(65) Prior Publication Data
US 2008/0191326 A1   Aug. 14, 2008

(30) Foreign Application Priority Data
Feb. 9, 2007   (TW) ............................... 96104750 A

(51) Int. Cl.
*H01L 21/4763* (2006.01)
(52) U.S. Cl. ...................... 438/618; 438/129; 438/620; 438/622
(58) Field of Classification Search ......... 438/611–624, 438/128–129; 257/666, 774
See application file for complete search history.

(56) References Cited

U.S. PATENT DOCUMENTS

| 7,012,019 | B2 * | 3/2006 | Hsu et al. ................... 438/618 |
| 7,602,062 | B1 * | 10/2009 | Wang ......................... 257/738 |
| 2008/0060838 | A1 * | 3/2008 | Chen et al. .................. 174/262 |

* cited by examiner

*Primary Examiner*—Dung A. Le
(74) *Attorney, Agent, or Firm*—Bacon & Thomas, PLLC

(57) ABSTRACT

Method for making a coreless packaging substrate are disclosed in the present invention. The coreless packaging substrate is made by first providing a metal adhesion layer having a melting point lower than that of the substrate, and removing a core board connected with the substrate therefrom through melting the metal adhesion layer. In addition, the disclosed packaging substrate further includes a circuit built-up structure of which has the electrical pads embedded under a surface. The disclosed packaging substrate can achieve the purposes of reducing the thickness, increasing circuit layout density, and facilitating the manufacturing of the substrate.

14 Claims, 5 Drawing Sheets

METHOD FOR MANUFACTURING CORELESS PACKAGING SUBSTRATE

BACKGROUND OF THE INVENTION

1. Field of the Invention

The present invention relates to a coreless packaging substrate and a method for manufacturing the same, and, more particularly, to a light weighted and compact coreless packaging substrate, and a method for manufacturing the same.

2. Description of Related Art

As the electronic industry develops rapidly, researches move towards electronic devices with multifunction and high efficiency. Hence, circuit boards with lots of active and passive components and circuit connections thereon transfer from single-layered boards to multiple-layered boards so that the requirements such as integration and miniaturization in semiconductor packaging substrate can be met. Furthermore, interlayer connection technique is also applied in this field to expand circuit layout space in a limited circuit board and to meet the demand of the application of high-density integrated circuits.

For manufacturing conventional semiconductor packaging structures, a chip is mounted on the top surface of a substrate first, and then connected thereto by wire bonding. Alternatively, the chip is connected with the substrate by flip chip technique. Subsequently, solder balls are disposed on the bottom surface of the substrate and electrically connected to a printed circuit board. However, even though the purpose of high quantity pin counts can be achieved through the method illustrated above, the electrical performance of a device operated in high frequency or at high speed can be unstable or limited due to the long paths of conductive circuits. Moreover, the complexity of the manufacturing process is relatively increased because many connective interfaces are required for conventional semiconductor packaging structures.

In the method for manufacturing a flip-chip substrate, a packaging substrate is formed by providing a core board at first, and then followed by drilling, metal electroplating, plugging, circuit patterning, and so on to complete an inner structure. Subsequently, a multilayer substrate is afforded by built-up processes, as shown in FIGS. 1A to 1E, which show a flowchart for manufacturing a built-up type multilayer substrate. In FIG. 1A, a core board 11 is prepared first. The core board 11 includes a core layer 111 having a predetermined thickness, and a circuit layer 112 formed thereon. Meanwhile, the core layer 111 has a plurality of plated through holes (PTHs) 113 formed therein so that the PTHs 113 can be electrically connected to the circuit layer 112 on the core layer 111. As shown in FIG. 1B, the core board 11 is processed through a built-up process. The built-up process is illustrated as follows. First, a dielectric layer 12 is disposed on the surface of the core board 11. The dielectric layer 12 has a plurality of vias exposing part of the circuit layer 112 serving as conductive pads 112a. With reference to FIG. 1C, a seed layer 14 is formed by electroless plating or sputtering on the surface of the dielectric layer 12. Then, a patterned resist layer 15 is formed on the seed layer 12 so that the conductive pads 112a can be exposed by a plurality of openings 150 formed in the resist layer 15. With regard to FIG. 1D, conductive vias 16a and a patterned circuit layer 16 are formed by electroplating respectively in the vias and in the openings 150 of the resist layer 15. The circuit layer 16 can be electrically connected to the conductive pads 112a by the connection of the conductive vias 16a. Subsequently, the resist layer 15 and the seed layer 14 covered thereby are removed to afford a first circuit built-up structure 10a. Referring to FIG. 1E, a second built-up structure 10b is formed on the surface of the first built-up structure 10a in the same manner as the first built-up structure 10a so that a multilayer packaging substrate 10 is obtained.

The above-mentioned manufacturing begins from provision of a core board, followed by drilling, metal electroplating, plugging, circuit patterning and so on to complete an inner structure, and finally to performing built-up processes to afford a multilayer packaging substrate. However, in the manufacturing illustrated above, there is a need to form PTHs by drilling and electroplating etc. Therefore, many circuit layout spaces are occupied by the PTHs because the diameter and the depth of each PTH are greater than those of each conductive via. Moreover, undesirable cross-talk, noises, or signal decay resulting from excessive length of signal transmitting pathway could easily occur. In order to solve the disadvantages arising from long signal transduction pathway, the design of the circuit layout is often dense on a chip disposition side electrically connected to a chip. In contrast, the density of the circuit layout on a solder ball disposition side connected to a printed circuit board could be sparse. For most of the packaging substrates, the numbers of the circuit layers on the both sides are identical. When the density of the circuit layout on the solder ball disposition side is too sparse, not only many layout spaces are idle, but also the number of laminated layers is increased. Because multiple circuit layers need to be included, manufacturing processes become more complex. In addition, the packaging substrate is hard to be used in high frequency because of long conductive circuits and high impedance.

SUMMARY OF THE INVENTION

In view of the above-mentioned, the present invention provides a method for manufacturing a coreless packaging substrate comprising the following steps. First, a core board is provided. Then, a metal adhesive layer is formed on the surface of the core board. Subsequently, a patterned first solder mask layer is formed on the surface of the metal adhesive layer, wherein the first solder mask layer has a plurality of first openings. Further, a metal pillar is formed in each of the first openings, and a metal layer is formed on the surface of the metal pillars and part of the surface of the first solder mask layer. Furthermore, a circuit built-up structure is formed on the surfaces of the metal layer and the first solder mask layer, wherein the metal layer is embedded in the circuit built-up structure. Moreover, a patterned second solder mask layer is formed on the circuit built-up structure, wherein the second solder mask layer has a plurality of second openings exposing circuits of the circuit built-up structure, and the exposed circuits serve as second conductive pads. Finally, the core board and the metal adhesive layer are removed to expose the metal pillars serving as first conductive pads.

Also, the present invention provides a coreless packaging substrate which can be manufactured by the foregoing method but is not limited thereto.

The coreless packaging substrate in the present invention comprises: a circuit built-up structure, a first solder mask layer, and a second solder mask layer. A plurality of metal layers are embedded under one surface of the circuit built-up structure, and a plurality of second conductive pads are formed on the other surface of the circuit built-up structure. The first solder mask layer is disposed on the surface of the circuit built-up structure having the metal layers, which has a plurality of first openings exposing part of the metal layers. Each of the first openings has a metal pillar therein, and the metal pillars serve as first conductive pads. The second solder mask layer is disposed on the surface of the circuit built-up structure having the second conductive pads, which has a plurality of second openings to expose the second conductive pads.

In the present invention, the first conductive pads and the second conductive pads can be bump pads or ball pads. While the first conductive pads are bump pads electrically connected to a chip, the second conductive pads in the other surface of the circuit built-up structure can be ball pads electrically connected to an electronic device such as a printed circuit board. On the other hand, while the first conductive pads are ball pads electrically connected to an electronic device such as a printed circuit board, the second conductive pads in the other surface of the circuit built-up structure can be bump pads electrically connected to a chip.

In the method for manufacturing a coreless packaging substrate in the present invention, the metal adhesive layer is formed by electroplating or electroless plating. In addition, the metal adhesive layer is made of a metal having a melting point lower than that of the packaging substrate. Preferably, the metal can be Sn. Therefore, the metal adhesive layer can be removed preferably by thermomelting so as to be removed at the same time of removing the core board.

In the processes for manufacturing a coreless packaging substrate in the present invention, the core board used preferably can be a copper clad laminate (CCL).

The method for manufacturing a coreless packaging substrate in the present can further comprise forming a seed layer prior to form the metal pillars and the metal layer. The seed layer is mainly used as a conductive pathway of electric currents for follow-up processes, and can be made of a material selected from the group consisting of Cu, Sn, Ni, Cr, Ti, and Cu—Cr alloys. Herein, the seed layer is made by sputtering or electroless plating.

In the method of the present invention for manufacturing a coreless packaging substrate, the metal pillars and the metal layer can be formed at the same time. In detail, a seed layer can be formed on the surface of the first solder mask layer and in the first openings. Subsequently, a patterned resist layer is formed on the first solder mask layer in order to expose the first openings. Then, electroplating is performed. Finally, the resist layer and the part of the seed layer covered by the resist layer are removed so that the metal pillars and the metal layer are formed at the same time. Besides, the metal pillars and the metal layer in the present invention can be preferably made of Cu.

In the method of the present invention for manufacturing a coreless packaging substrate, the first openings in the first solder mask and the second openings in the second solder mask are formed preferably by photolithography process including exposing and developing.

The circuit built-up structure of the present invention can comprise a dielectric layer, circuit layers disposed on the dielectric layer, and conductive vias formed in the dielectric layer. Besides, the circuit built-up structure of the present invention can be monolayer or multilayer. The circuit layers in the circuit built-up structure of the present invention, which also includes the second conductive pads formed from the circuit layers on the surface of the circuit built-up structure, and the conductive vias can be made of a material selected from the group consisting of Cu, Sn, Ni, Cr, Ti, and Cu—Cr alloys, but preferably is made of Cu.

In conclusion, the present invention provides a solution to problems such as low circuit layout density, excessive circuit layers, long conductive lines and high impedance in a general packaging substrate having a core board. Additionally, the coreless packaging substrate of the present invention does not have through holes so as to achieve the purposes of advanced circuit layout density, reduced manufacture procedures, and decreased thickness of the packaging substrate. Therefore, the object of obtaining a lightweight and compact packaging substrate can be accomplished.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
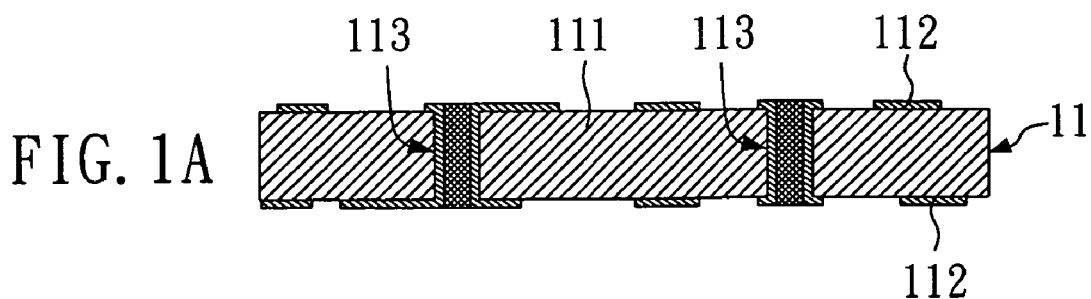
FIGS. 1A to 1E are cross-sectional views of conventional packaging substrates.
Figure 1B:
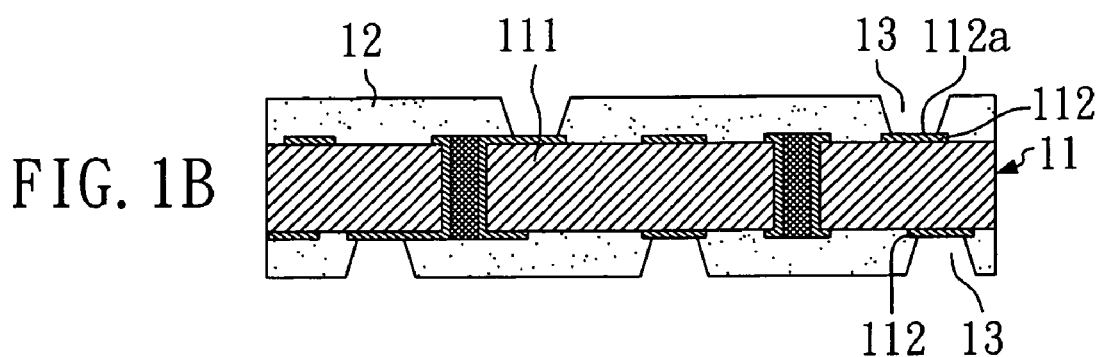
Figure 1C:
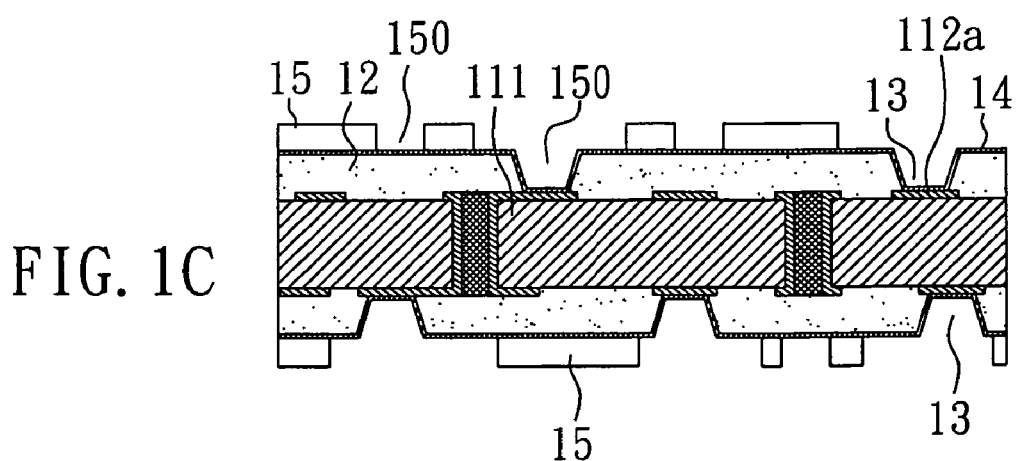
Figure 1D:
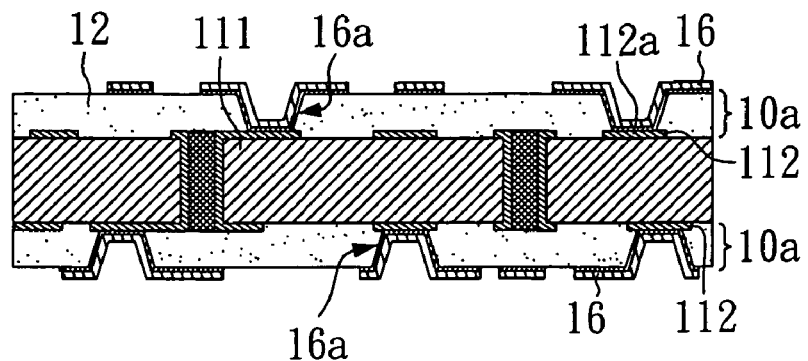
Figure 1E:
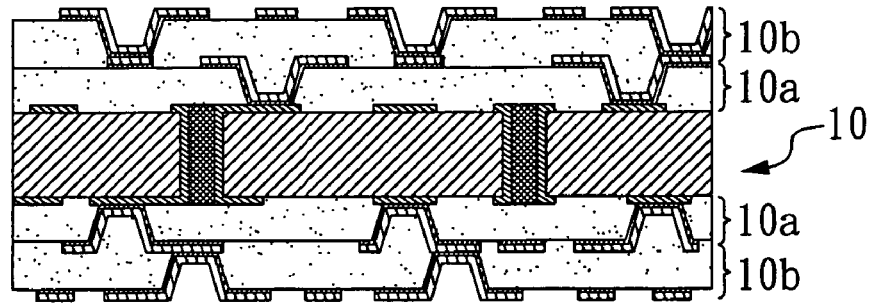

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements revealed in the drawings are not necessarily aspects of the practice, and quantity and shape thereof are optionally designed. Further, the design aspect of the elements can be more complex.

EXAMPLE 1

With reference to FIGS. 2A to 2E, there is shown a process flow for manufacturing a coreless packaging substrate in a cross-sectional view in the present example.

Figure 2A:
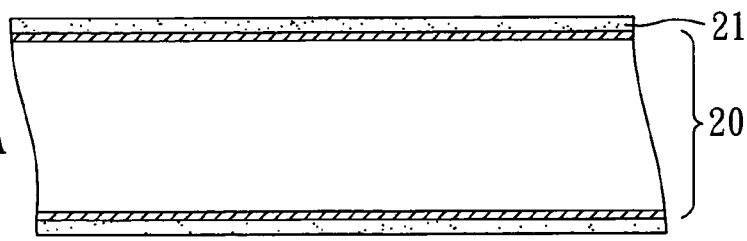
FIGS. 2A to 2E show a flow chart for manufacturing a coreless packaging substrate in a cross-sectional view in a preferred example of the present invention.

As shown in FIG. 2A, a core board 20 is provided first. In the present example, a copper clad laminate is used as the core board 20. Then, a metal adhesive layer 21 is formed on the surface of the core board 20 by electroplating or electroless plating. The material of the metal adhesive layer 21 used in the present example is Sn. The melting point of Sn is at about 232° C., and that is lower than those of other materials used in the packaging substrate of the present example. Besides, the copper clad laminated used in the present example is beneficial to form the metal adhesive layer 21 thereon.

Figure 2B:
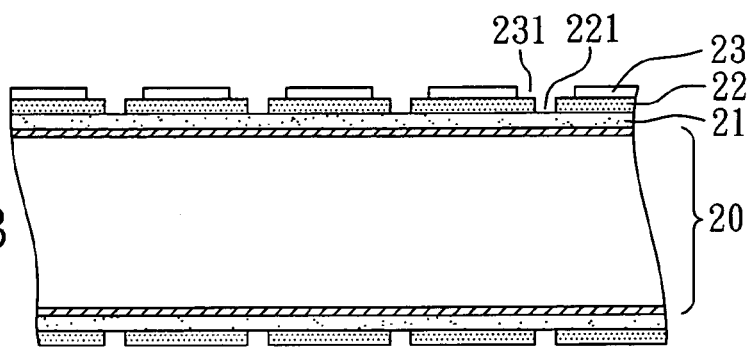

Subsequently, a patterned first solder mask layer 22 is formed on the surface of the metal adhesive layer 21 as shown in FIG. 2B. For example, the first solder mask layer 22 can be made of photoimagable polymer. A plurality of first openings are formed in the first solder mask layer by photolithography. Then, a seed layer (not shown) is formed by sputtering or electroless plating on the surface of the first solder mask layer 22 and in the first openings 221. The seed layer can be made of a material selected from the group consisting of Cu, Sn, Ni, Cr, Ti, and Cu—Cr alloys, but preferably is made of Cu. Furthermore, a resist layer 23 is formed on the surface of the first solder mask layer 22. A resist open area 231 corresponding to each of the first openings 221 is formed by photolithography. Herein, the resist layer 23 can be made of dry film or liquid photoresist. In the present example, dry film is used as the resist layer 23.

Figure 2C:
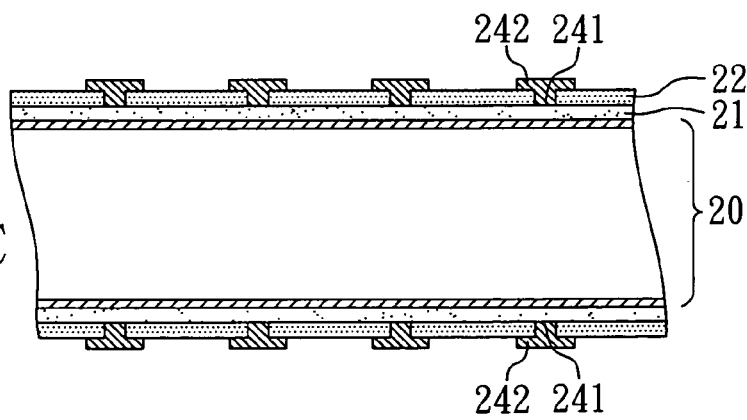

Further, a metal pillar 241 and a metal layer 242 are formed by electroplating or electroless plating respectively in each of the first openings 221 and in each of the resist open areas 231. Then, the resist layer 23 and the part of the seed layer covered by the resist layer 23 are removed so that the structure as shown in FIG. 2C can be afforded.

Figure 2D:
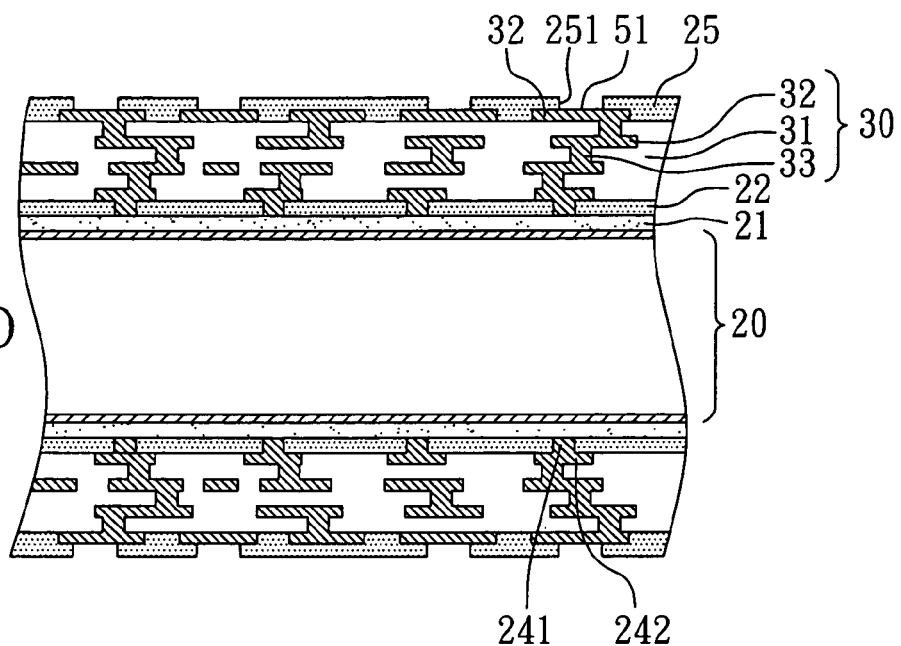

Furthermore, in FIG. 2D, a circuit built-up structure 30 is formed on the surfaces of the metal layer 242 and the first solder mask layer 22. The circuit built-up structure 30 comprises a dielectric layer 31, circuit layers 32, and conductive vias 33. The circuit layers 32 are formed by photolithography of a resist layer (not shown) together with electroplating, and disposed on the dielectric layer 31. The conductive vias 33 are formed in the dielectric layer 31 through forming vias (not shown) by laser ablation together with electroplating. Herein, the metal layer 242 is embedded in the dielectric layer 30 of the circuit built-up structure 30. The conductive vias 33 can be electrically connected to the metal layer 242. In addition, the circuit layers 32 and the conductive vias 33 can be made of a material selected from the group consisting of Cu, Sn, Ni, Cr, Ti, and Cu—Cr alloys. In the present example, Cu is used as the material of the circuit layers 32 and the conductive vias 33. The dielectric layer 31 can be made of, for example, Ajinomoto Build-up Film (ABF). Subsequently, a second solder mask layer 25 is formed on the circuit built-up structure 30. A plurality of second openings 251 are formed by photolithography on the second solder mask layer 25 so as to expose the circuit layers 32 of the circuit built-up structure 30, and the exposed circuit layers 32 can serve as ball pads 51 which can be electrically connected to an electronic device such as printed circuit board.

Figure 2E:
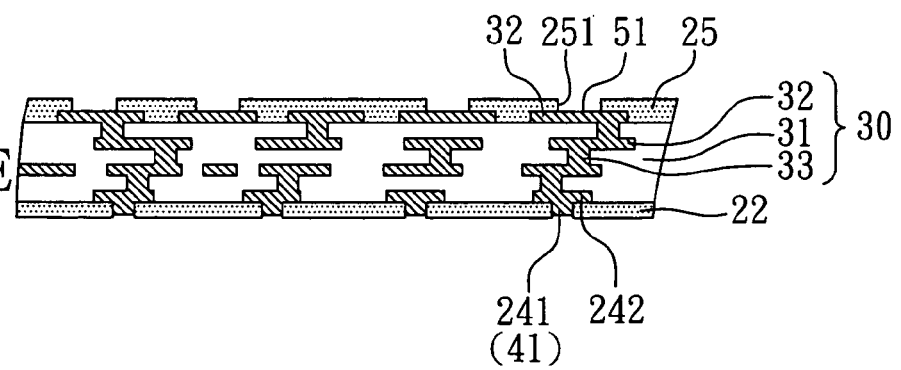

Finally, as shown in FIG. 2E, the structure shown in FIG. 2D can be heated to melt the metal adhesive layer 21. Due to the metal adhesive layer 21 having a melting point lower than those of the other materials used in the packaging substrate of the present example, the temperature can be raised to the point higher than the melting point of the metal adhesive layer 21 but lower than that being tolerated by the other materials in the packaging substrate so that the core board 20 can be removed after the metal adhesive layer 21 is melted. After that, chemical solutions can be used to clean and remove residues of the metal adhesive layer 21. Surface treatment can be further performed on the metal pillars 241 to improve the performance of the packaging substrate. Posterior to removing the core board 20, the metal pillars 241 of the circuit built-up structure formed in each of the first openings 221 can serve as a bump pad 41 capable of being electrically connected to a chip. Accordingly, the coreless packaging substrate of the present invention is manufactured.

Conclusively, the coreless packaging substrate in the present example, as shown in FIG. 2E, comprises: a circuit built-up structure 30, a first solder mask layer 22, and a second solder mask layer 25. A plurality of metal layers 242 are embedded under one surface of the circuit built-up structure 30, and a plurality of ball pads 51 are formed on the other surface of the circuit built-up structure 30. The first solder mask layer 22 is disposed on the surface of the circuit built-up structure 30 having the metal layers 242, which has a plurality of first openings 221 exposing part of the metal layers 242. Each of the first openings 221 has a metal pillar 241 therein, and the respective metal pillar 241 serves as a bump pad 41. The second solder mask layer 25 is disposed on the surface of the circuit built-up structure 30 having the bump pads 51, which has a plurality of second openings 251 to expose the bump pads 51.

EXAMPLE 2

Figure 3A:
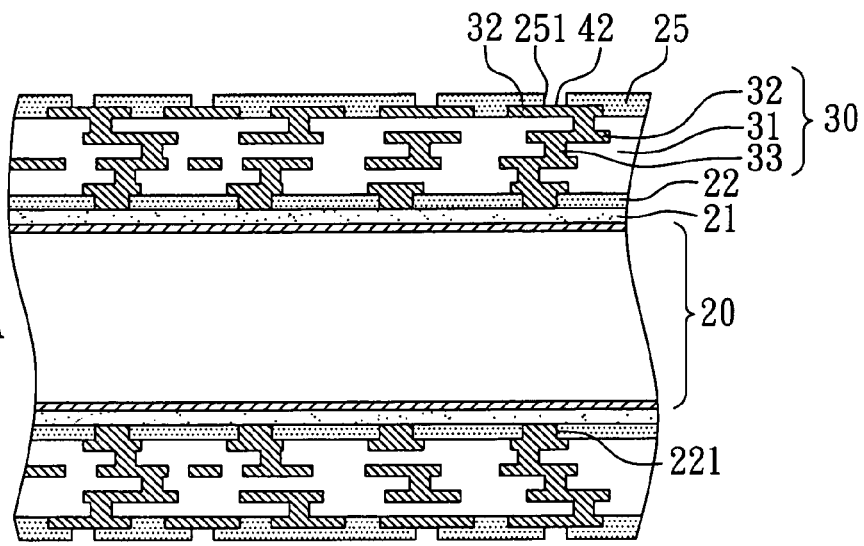
FIGS. 3A to 3B show part of a flow chart for manufacturing a coreless packaging substrate in a cross-sectional view in a preferred example of the present invention.
Figure 3B:
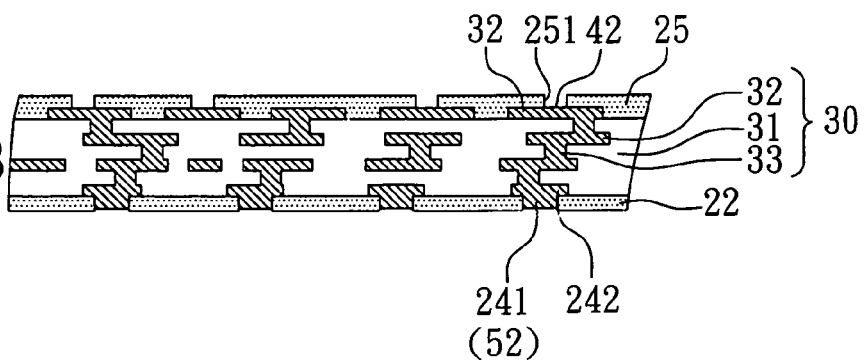

With reference to FIGS. 3A to 3B, there is shown a flow chart for manufacturing a coreless packaging substrate in a cross-sectional view in the present example. The manner of the present example is approximately similar to that of Example 1, but there are differences illustrated as follows. As shown in FIG. 3A, the metal pillars 241 in the present example are used mainly for conduction to an electronic device such as printed circuit board in the follow-up processes. Positions exposed by the second openings 251 of the second solder mask layer 25 on the circuit layers 32 in the circuit built-up structure 30 are used for connection to a chip in the follow-up processes. Therefore, the first openings 221 formed in the first solder mask layer 22 are of the diameter larger than those of the second openings 251 formed in the second solder mask layer 25.

The subsequent steps are the same as those of the Example 1. After the core board 20 is removed in the present example, as shown in FIG. 3B, each metal pillar 241 can serve as a ball pad 52 electrically connected to printed circuit board. Finally, the coreless packaging substrate of the present example can be afforded.

Accordingly, the coreless packaging substrate of the present example is different from that of the Example 1, especially in that each metal pillar 241 embedded under one surface of the circuit built-up structure 30 serves as a ball pad 52 for conduction to printed circuit board, and the bump pads formed on the other surface of the circuit built-up structure 30 are electrically connected to a chip.

In conclusion, the present invention provides a metal adhesive layer which has a melting point lower than that of the coreless packaging substrate thereof. This is why the core board adhered to the coreless packaging substrate of the present invention can be removed by using the above-mentioned property of the metal adhesive layer. Besides, in the circuit built-up structure of the packaging substrate in the present invention, the metal layers are embedded under one surface thereof. The solder mask layer is disposed on the surface having the metal layers and has a plurality of openings exposing part of the metal layers. Additionally, there is a metal pillar in each of the openings, and each metal pillar can serve as a bump or ball pad so as to be electrically connected to a chip or printed circuit board. Hence, in the present invention, not only the purposes (for an advance in circuit layout density and possession of a compact and light packaging substrate) can be achieved, but also the problems (such as large number of circuit layers and complexity of manufacturing processes) can be solved.

Although the present invention has been explained in relation to its preferred embodiment, it is to be understood that many other possible modifications and variations can be made without departing from the scope of the invention as hereinafter claimed.

What is claimed is:

1. A method for manufacturing a coreless packaging substrate comprising the following steps:
   providing a core board;
   forming a metal adhesive layer on the surface of the core board;
   forming a patterned first solder mask layer on the surface of the metal adhesive layer, wherein the first solder mask layer has a plurality of first openings;

forming a metal pillar in each of the first openings, and forming a metal layer on the surface of the metal pillar and part of the surface of the first solder mask layer;

forming a circuit built-up structure on the surfaces of the metal layer and the first solder mask layer, wherein the metal layer is embedded in the circuit built-up structure;

forming a patterned second solder mask layer on the circuit built-up structure, wherein the second solder mask layer has a plurality of second openings exposing circuits of the circuit built-up structure, and the exposed circuits serve as second conductive pads; and removing the core board and the metal adhesive layer to expose the metal pillar serving as first conductive pads.

2. The method as claimed in claim 1, wherein the first conductive pads are bump pads electrically connected to a chip, and the second conductive pads are ball pads electrically connected to an electronic device.

3. The method as claimed in claim 1, wherein the first conductive pads are ball pads electrically connected to an electronic device, and the second conductive pads are bump pads electrically connected to a chip.

4. The method as claimed in claim 1, wherein the metal adhesive layer is formed by electroplating or electroless plating.

5. The method as claimed in claim 1, wherein the metal adhesive layer is made of a metal having a melting point lower than that of the packaging substrate.

6. The method as claimed in claim 5, wherein the metal is Sn.

7. The method as claimed in claim 1, wherein the core board is a copper clad laminate.

8. The method as claimed in claim 1, further comprising a step of forming a seed layer prior to formation of the metal pillar and the metal layer.

9. The method as claimed in claim 1, wherein the respective metal pillar and the metal layer are formed at the same time.

10. The method as claimed in claim 1, wherein the metal pillar and the metal layer are made of Cu.

11. The method as claimed in claim 1, wherein the first and second openings are formed by photolithography.

12. The method as claimed in claim 1, wherein the circuit built-up structure comprises a dielectric layer, circuit layers disposed on the dielectric layer, and conductive vias formed in the dielectric layer.

13. The method as claimed in claim 1, wherein the circuit built-up structure is single-layered or multilayer.

14. The method as claimed in claim 1, wherein the core board and the metal adhesive layer are removed by thermomelting.

* * * * *